(12) United States Patent
Furutani

(10) Patent No.: US 12,283,760 B2
(45) Date of Patent: Apr. 22, 2025

(54) RADIO-FREQUENCY MODULE AND COMMUNICATION APPARATUS

(71) Applicant: Murata Manufacturing Co., Ltd., Kyoto (JP)

(72) Inventor: Koji Furutani, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 128 days.

(21) Appl. No.: 18/158,106

(22) Filed: Jan. 23, 2023

(65) Prior Publication Data

US 2023/0163464 A1    May 25, 2023

Related U.S. Application Data

(63) Continuation of application No. PCT/JP2021/034462, filed on Sep. 21, 2021.

(30) Foreign Application Priority Data

Sep. 30, 2020   (JP) .................. 2020-164926

(51) Int. Cl.
*H01Q 1/22*     (2006.01)
*H01Q 1/42*     (2006.01)
*H01Q 5/335*   (2015.01)

(52) U.S. Cl.
CPC ........... *H01Q 5/335* (2015.01); *H01Q 1/2283* (2013.01); *H01Q 1/422* (2013.01)

(58) Field of Classification Search
CPC ...... H01Q 1/2283; H01Q 1/38; H01Q 21/065; H01Q 1/52; H01L 23/66; H01L 2223/6677
See application file for complete search history.

(56) References Cited

U.S. PATENT DOCUMENTS 8,063,846 B2 * 11/2011 Imaoka ................ H01Q 1/2283
                                                          343/851
2004/0201082 A1   10/2004 Ochiai et al.
(Continued)

FOREIGN PATENT DOCUMENTS

JP   2004-273570 A    9/2004
JP   2010-267944 A   11/2010
(Continued)

OTHER PUBLICATIONS

International Search Report for PCT/JP2021/034462 dated Nov. 22, 2021.

*Primary Examiner* — Hasan Islam
(74) *Attorney, Agent, or Firm* — McDonald Hopkins LLC

(57) ABSTRACT

A radio-frequency module includes a multilayer substrate, a first semiconductor device, a second semiconductor device, a first mold layer, and a second mold layer. The multilayer substrate includes a plurality of stacked layers, and has a first major face and a second major face. The first mold layer seals the first semiconductor device. The second mold layer seals the second semiconductor device. The first major face includes a first recess. The first semiconductor device is mounted over a bottom face of the first recess. The second semiconductor device is mounted over the first major face so as to overlie the first recess. The first semiconductor device is connected with a metallic via that extends through a portion of the multilayer substrate from the bottom face of the first recess to the second major face. The first mold layer and the second mold layer are made of different materials.

20 Claims, 5 Drawing Sheets

(56) References Cited

U.S. PATENT DOCUMENTS

| | | |
|---|---|---|
| 2010/0109052 A1 | 5/2010 | Nakajima et al. |
| 2015/0137346 A1* | 5/2015 | Kwon .................. H01L 21/565 438/109 |
| 2019/0311965 A1 | 10/2019 | Yanagida |
| 2021/0233865 A1 | 7/2021 | Tarui et al. |
| 2021/0335734 A1* | 10/2021 | You ........................ H01L 24/20 |

FOREIGN PATENT DOCUMENTS

| | | |
|---|---|---|
| JP | 2012-191039 A | 10/2012 |
| JP | 2019-186344 A | 10/2019 |
| WO | 2020/054004 A1 | 3/2020 |

* cited by examiner

RADIO-FREQUENCY MODULE AND COMMUNICATION APPARATUS

CROSS REFERENCE TO RELATED APPLICATION

This is a continuation of International Application No. PCT/JP2021/034462 filed on Sep. 21, 2021 which claims priority from Japanese Patent Application No. 2020-164926 filed on Sep. 30, 2020. The contents of these applications are incorporated herein by reference in their entireties.

BACKGROUND OF THE DISCLOSURE

Field of the Disclosure

The present disclosure relates to a radio-frequency module, and a communication apparatus.

Description of the Related Art

For example, Patent Document 1 discloses a module including the following components: a module substrate; a low-noise amplifier, a power amplifier, and a switching IC that are mounted on one major face of the module substrate; and a low-temperature co-fired ceramic component mounted on the other major face of the module substrate and including a plurality of stacked ceramic layers. This configuration allows for miniaturization of the module.

Patent Document 1: Japanese Unexamined Patent Application Publication No. 2012-191039

BRIEF SUMMARY OF THE DISCLOSURE

Some components of a multilayer substrate such as one disclosed in Patent Document 1 generate heat. In some cases, such a component is connected with a metallic via extending through the multilayer substrate, and heat is dissipated by use of the metallic via. Since the multilayer substrate is made up of a plurality of stacked layers, the metallic via extending through these layers tends to have an extended length. This tends to result in an extended heat dissipation path, which may make it difficult to achieve sufficient heat dissipation.

Accordingly, it is a possible benefit of the present disclosure to provide a radio-frequency module and a communication apparatus that allow for improved heat dissipation capability of the multilayer substrate.

A radio-frequency module according to an aspect of the present disclosure includes a multilayer substrate, a first semiconductor device, a second semiconductor device, a first mold layer, and a second mold layer. The multilayer substrate includes a plurality of stacked layers, and has a first major face and a second major face. The first mold layer seals the first semiconductor device. The second mold layer seals the second semiconductor device. The first major face includes a first recess. The first semiconductor device is mounted over a bottom face of the first recess. The second semiconductor device is mounted over the first major face so as to overlie the first recess. The first semiconductor device is connected with a metallic via. The metallic via extends through a portion of the multilayer substrate from the bottom face of the first recess to the second major face. The first mold layer and the second mold layer are made of different materials.

A communication apparatus according to an aspect of the present disclosure includes a radio-frequency integrated circuit that processes a radio-frequency signal transmitted and received by an antenna, and the radio-frequency module mentioned above that propagates the radio-frequency signal between the antenna and the radio-frequency integrated circuit.

A radio-frequency module or other apparatus according to the present disclosure makes it possible to improve the heat dissipation capability of a multilayer substrate.

DETAILED DESCRIPTION OF THE DISCLOSURE

Figure 1A:
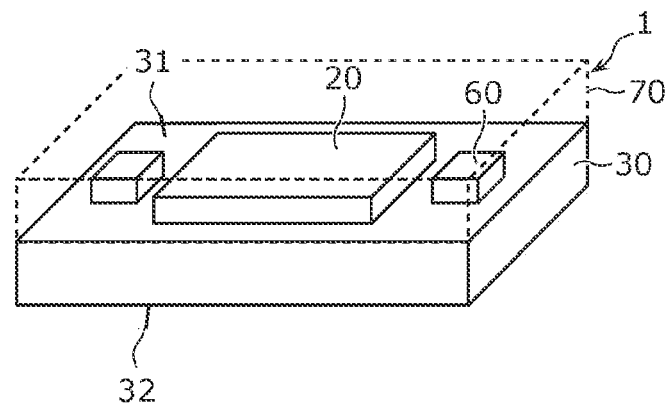
FIG. 1A is an exterior perspective view of an example of a radio-frequency module according to an embodiment.

Embodiments of the present disclosure will be described in detail below with reference to the drawings. The embodiments described below each represent a generic or specific example. Features presented in the following embodiments, such as numerical values, shapes, materials, components, and the placement and connection of components, are illustrative only and not intended to be limiting of the present disclosure. Of the components illustrated in the following embodiments, those components not described in the independent claim representing the broadest concept of the present disclosure will be described as optional components. The sizes of the components illustrated in the drawings or the ratios between the sizes of these components are not necessarily drawn to scale. Throughout the drawings, identical reference signs are used to designate substantially identical features, and repetitive description will be sometimes omitted or simplified. As used in the following description of the embodiments, the term "connected" includes not only a case of being connected directly but also includes a case of being electrically connected via, for example, another element or device.

For convenience, in each of the figures described below, a face of each of components such as elements, devices, and substrates that is located at the upper side of the figure will be referred to as a top face, a face thereof that is located at the lower side of the figure will be referred to as a bottom face, and a face of a recess that is located at the lower side of the figure will be referred to as a bottom face.

EMBODIMENTS

Embodiments will be described below with reference to the drawings.

[Configuration of Radio-Frequency Module]

The configuration of a radio-frequency module 1 will be described first.

FIG. 1A is an exterior perspective view of an example of the radio-frequency module 1 according to an embodiment.

Figure 1B:
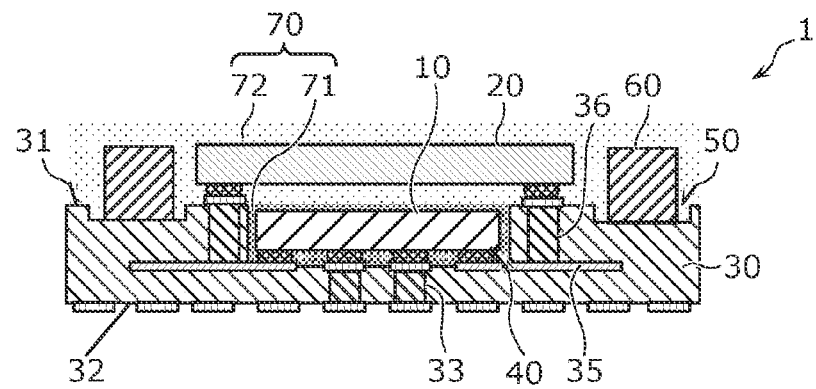
FIG. 1B is a cross-sectional view of the example of the radio-frequency module according to the embodiment.

FIG. 1B is a cross-sectional view of the example of the radio-frequency module 1 according to the embodiment.

The radio-frequency module 1 is, for example, a module for processing (e.g., amplifying) a radio-frequency signal. As illustrated in FIGS. 1A and 1B, the radio-frequency module 1 includes a multilayer substrate 30, a first semiconductor device 10, a second semiconductor device 20, a mount component 60, and a mold layer 70. In FIG. 1A, the mold layer 70 is illustrated in see-through form.

The multilayer substrate 30 includes a plurality of stacked layers, and has a first major face 31 and a second major face 32. Non-limiting examples of the multilayer substrate 30 include the following substrates formed by stacking a plurality of dielectric layers: a low temperature co-fired ceramic (LTCC) substrate; a high temperature co-fired ceramic (HTCC) substrate; a substrate with built-in components; a substrate with a redistribution layer (RDL); and a printed circuit board. The first major face 31 is provided with terminals for mounting a component or other object to the radio-frequency module 1. The second major face 32 is provided with terminals for mounting the radio-frequency module 1 to a mother board or other component. The first major face 31 includes a first recess 40, and a second recess 50. For example, the second recess 50 has a depth less than a depth of the first recess 40. A depth in this case refers to a dimension in the direction of the thickness of the multilayer substrate 30 (the direction orthogonal to the first major face 31 and the second major face 32 of the multilayer substrate 30). As various conductors (e.g., conductor films, metallic vias, and terminals) constituting the multilayer substrate 30, for example, Al, Cu, Au, Ag, or metals mainly containing alloys thereof are used.

The first semiconductor device 10 is a device to be mounted over a bottom face of the first recess 40 provided in the first major face 31 of the multilayer substrate 30 (a face of the first recess 40 substantially parallel to a portion of the first major face 31 of the multilayer substrate 30 where the first recess 40 is not present). For example, the first semiconductor device 10 is mounted by use of a solder bump or other connection element to each terminal or conductor film provided in the first recess 40. The first semiconductor device 10 includes a power amplifier circuit. The power amplifier circuit included in the first semiconductor device 10 will be hereinafter referred to also as a first power amplifier circuit. The first semiconductor device 10 includes a compound semiconductor substrate. For example, the compound semiconductor substrate may be provided with the first power amplifier circuit, and the first semiconductor device 10 may thus include the first power amplifier circuit. The compound semiconductor substrate is made of, for example, at least one of GaAs, SiGe, or GaN. This allows the first power amplifier circuit with superior amplification performance and noise performance to be implemented by the first semiconductor device 10. A power amplifier circuit is typically susceptible to generating heat, and hence it can be said that the first semiconductor device 10 is a device susceptible to generating heat. Expressed in another way, a compound semiconductor substrate typically has poor heat dissipation capability, and hence it can be said that the first semiconductor device 10 is a device susceptible to generating heat.

The first semiconductor device 10 is connected with a metallic via 33. The metallic via 33 extends through a portion of the multilayer substrate 30 from the bottom face of the first recess 40 to the second major face 32. For example, the metallic via 33 is connected with a ground terminal disposed on the second major face 32. The metallic via 33 does not have to be formed integrally. Alternatively, the metallic via 33 may be formed by the interconnection of metallic vias formed individually for each layer of the multilayer substrate 30. In a portion of the multilayer substrate 30 where the first recess 40 is present, the multilayer substrate 30 is reduced in thickness by an amount equal to the depth of the first recess 40. This means that the metallic via 33, which extends through a portion of the multilayer substrate 30 from the bottom face of the first recess 40 to the second major face 32, is likewise reduced in length by the corresponding amount.

The second semiconductor device 20 is a device to be mounted over the first major face 31 of the multilayer substrate 30 so as to overlie the first recess 40 in which the first semiconductor device 10 is mounted. With the radio-frequency module 1 seen in top view (with the multilayer substrate 30 viewed from above the first major face 31), the second semiconductor device 20 may be mounted so as to cover the entire first recess 40, or may be mounted so as to cover a portion of the first recess 40. In other words, with the radio-frequency module 1 seen in top view, the entire first recess 40 may be blocked by the second semiconductor device 20 and thus be invisible, or a portion of the first recess 40 may extend beyond the second semiconductor device 20 and thus be visible. The second semiconductor device 20 includes at least one of a low-noise amplifier circuit, a switching circuit, or a control circuit. The second semiconductor device 20 includes a silicon semiconductor substrate. For example, the silicon semiconductor substrate may be provided with at least one of a low-noise amplifier circuit, a switching circuit, or a control circuit, and the second semiconductor device 20 may thus include the at least one of a low-noise amplifier circuit, a switching circuit, or a control circuit. The silicon semiconductor substrate may be a silicon-on-insulator (SOI) substrate formed by a SOI process, or a substrate employing a complementary metal oxide semiconductor (CMOS) with no insulator film contained therein. This configuration allows the second semiconductor device 20 to be manufactured inexpensively. Since a low-noise amplifier circuit, a switching circuit, and a control circuit are typically less susceptible to generating heat than a power amplifier circuit, it can be said that the second semiconductor device 20 is a device not susceptible to generating heat. Expressed in another way, a silicon semiconductor substrate typically allows for better heat dissipation than a compound semiconductor substrate, and hence it can be said that the second semiconductor device 20 is a device not susceptible to generating heat.

The multilayer substrate 30 includes an electric conductor. The electric conductor is disposed at least inside the multilayer substrate 30, and electrically connects the first semiconductor device 10 and the second semiconductor device 20 with each other. For example, the electric conductor of the multilayer substrate 30 includes a conductor film 35, and a metallic via 36. The conductor film 35 extends from the interior of the multilayer substrate 30 to the bottom face of the first recess 40, where the conductor film 35 is connected with each terminal of the first semiconductor device 10. The metallic via 36 is connected with the conductor film 35 in the interior of the multilayer substrate 30, and extends from the conductor film 35 to the first major face 31, where the metallic via 36 is connected with each terminal of the second semiconductor device 20. The electric conductor enables the exchange of information or signals between the first semiconductor device 10 and the second semiconductor device 20.

The mount component 60 is a component to be mounted onto a bottom face of the second recess 50 provided in the first major face 31 of the multilayer substrate 30 (a face of the second recess 50 substantially parallel to a portion of the first major face 31 of the multilayer substrate 30 where the second recess 50 is not present). For example, solder is applied by use of a metal mask onto the bottom face of the second recess 50, and the mount component 60 is mounted with the solder onto the bottom face of the second recess 50. Non-limiting examples of the mount component 60 include: an inductor or a capacitor that constitutes a matching circuit connected with an amplifier circuit or other circuit; a bypass capacitor connected with a control circuit 141 described later; and a capacitor used for DC cutting. Many of these exemplified components typically have relatively large sizes. The mount component 60 thus has a thickness greater than a thickness of the second semiconductor device 20.

The mold layer 70 includes a first mold layer 71, and a second mold layer 72.

The first mold layer 71 seals the first semiconductor device 10. For example, the first mold layer 71 covers the entire first semiconductor device 10, including a top face of the first semiconductor device 10 (which is a face of the first semiconductor device 10 opposite from its face near the bottom face of the first recess 40, and is a face of the first semiconductor device 10 near the second semiconductor device 20). For example, after the first semiconductor device 10 is mounted into the first recess 40, a resin component that serves as the first mold layer 71 is injected into the first recess 40 until the top face of the first semiconductor device 10 becomes invisible. The first semiconductor device 10 can be thus sealed by the first mold layer 71 such that the top face of the first semiconductor device 10 is covered by the first mold layer 71. In another configuration, the first mold layer 71 does not have to cover the top face of the first semiconductor device 10. The configuration in this case is described below with reference to FIG. 1C.

Figure 1C:
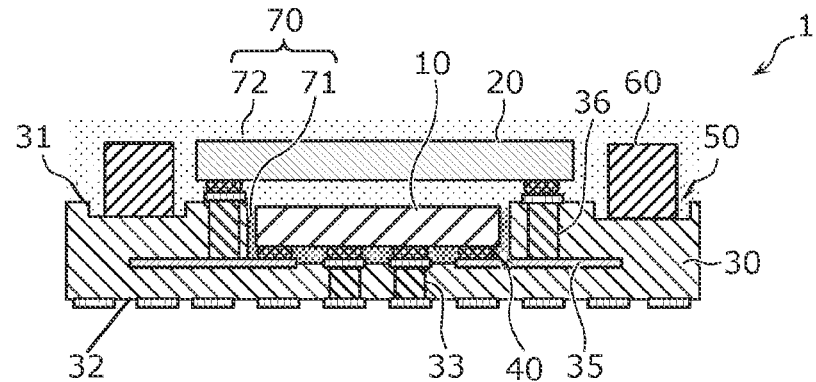
FIG. 1C is a cross-sectional view of another example of the radio-frequency module according to the embodiment.

FIG. 1C is a cross-sectional view of another example of the radio-frequency module 1 according to the embodiment.

As illustrated in FIG. 1C, the first mold layer 71 does not have to cover the top face of the first semiconductor device 10. In this case, after the first semiconductor device 10 is mounted into the first recess 40, a resin component that serves as the first mold layer 71 is injected into the first recess 40 to such an extent that the top face of the first semiconductor device 10 remains visible. This allows the first mold layer 71 to seal the first semiconductor device 10 such that the first mold layer 71 does not cover the top face of the first semiconductor device 10.

The second mold layer 72 seals the second semiconductor device 20. For example, after the second semiconductor device 20 is mounted over the first major face 31 such that the second semiconductor device 20 overlies the first recess 40 into which a resin component that serves as the first mold layer 71 has been injected, a resin component that serves as the second mold layer 72 is injected over the first major face 31. The second semiconductor device 20 can be thus sealed by the second mold layer 72. For example, together with the second semiconductor device 20, the mount component 60 mounted on the first major face 31 may be sealed by the second mold layer 72. In this case, after the second semiconductor device 20 and the mount component 60 are mounted over the first major face 31, a resin component that serves as the second mold layer 72 is injected over the first major face 31. The second semiconductor device 20 and the mount component 60 can be thus sealed by the second mold layer 72.

The first mold layer 71 and the second mold layer 72 may be made of different materials.

For example, the first mold layer 71 may be made of a material that allows for better heat dissipation than the material of the second mold layer 72, and the first mold layer 71 may have a thermal conductivity higher than the thermal conductivity of the second mold layer 72.

For example, the second mold layer 72 may be made of a material that can be worked more easily (e.g., can be cut with a dicing machine more easily) than the material of the first mold layer 71. For example, the first mold layer 71 may be made of a resin containing additives such as alumina, and the second mold layer 72 may be made of a resin not containing additives such as alumina.

Circuit Configuration of Communication Apparatus: First Example

Reference is now made to a circuit configuration of a communication apparatus 5 including the radio-frequency module 1.

Figure 2:
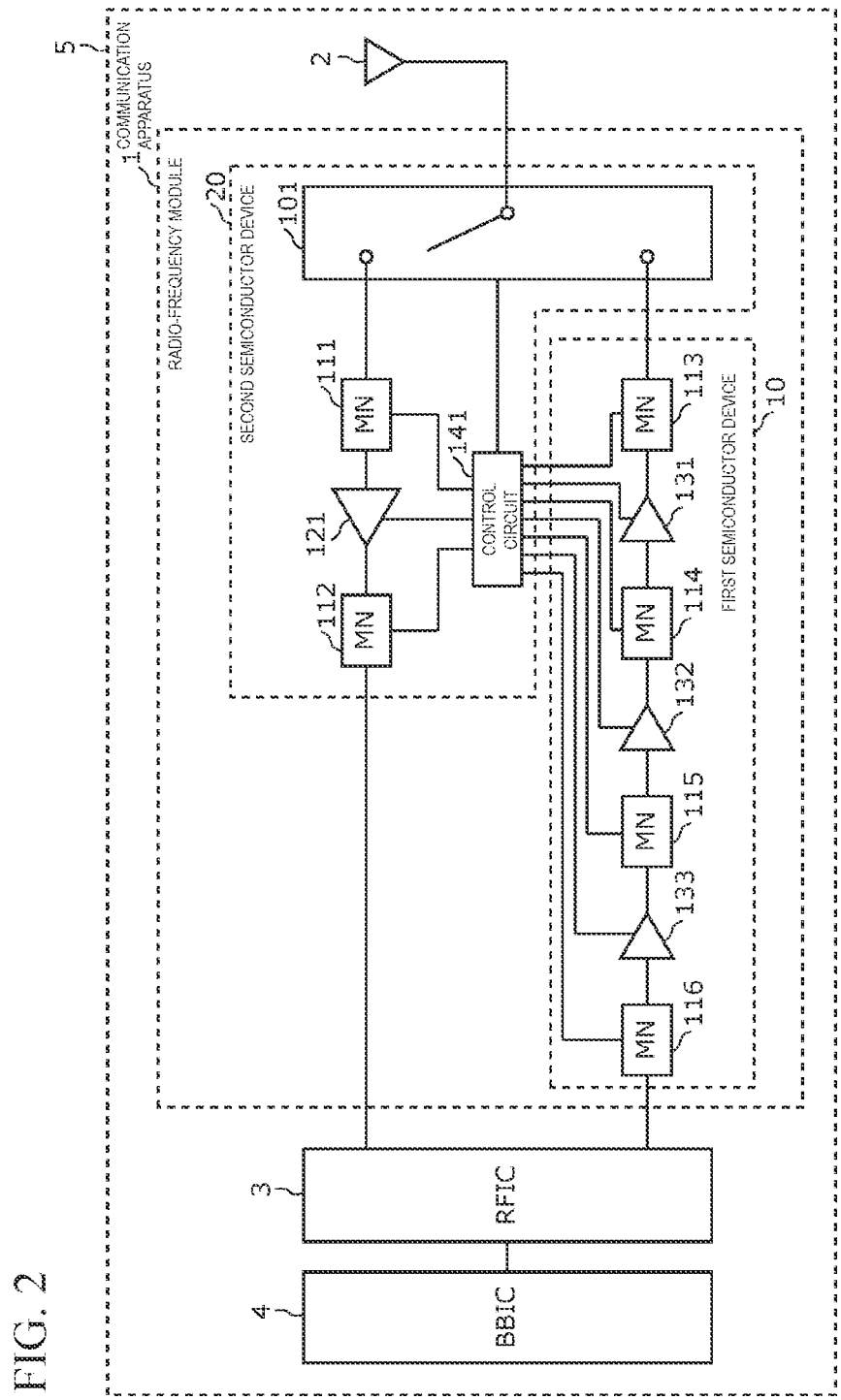
FIG. 2 is a circuit diagram illustrating a first example of a communication apparatus according to the embodiment.

FIG. 2 is a circuit diagram illustrating a first example of the communication apparatus 5 according to the embodiment. As illustrated in FIG. 2, the communication apparatus 5 includes the radio-frequency module 1, an antenna 2, a radio-frequency integrated circuit (RFIC) 3, and a baseband integrated circuit (BBIC) 4.

The RFIC 3 processes radio-frequency signals transmitted and received by the antenna 2. More specifically, the RFIC 3 applies signal processing such as down-conversion to a radio-frequency receive signal inputted through a receive signal path of the radio-frequency module 1, and outputs the processed receive signal to the BBIC 4. The RFIC 3 also applies signal processing such as up-conversion to a transmit signal inputted from the BBIC 4, and outputs the processed radio-frequency transmit signal to a transmit signal path of the radio-frequency module 1.

The BBIC 4 performs signal processing by use of a band of intermediate frequencies lower than the frequencies of radio-frequency signals that propagate in the radio-frequency module 1. A signal processed by the BBIC 4 is used as, for example, a video signal for image display, or as an audio signal for telephone conversation using a speaker.

The antenna 2 is connected with the radio-frequency module 1. The antenna 2 radiates a radio-frequency signal outputted from the radio-frequency module 1. Further, the antenna 2 receives an extraneous radio-frequency signal, and outputs the received radio-frequency signal to the radio-frequency module 1. The communication apparatus 5 according to the embodiment is not necessarily required to include the antenna 2 and the BBIC 4. That is, the communication apparatus 5 does not have to include at least one of the antenna 2 or the BBIC 4.

Reference is now made to a detailed configuration of the radio-frequency module 1.

As illustrated in FIG. 2, the radio-frequency module 1 includes a switching circuit 101, matching circuits 111, 112, 113, 114, 115, and 116, a low-noise amplifier circuit 121, power amplifier circuits 131, 132, and 133, and the control circuit 141. In the first example of the communication apparatus 5 illustrated in FIG. 2, the first semiconductor device 10 includes the power amplifier circuits 131, 132, and 133 and the matching circuits 113, 114, 115, and 116, and the second semiconductor device 20 includes the low-noise amplifier circuit 121, the switching circuit 101, the control circuit 141, and the matching circuits 111 and 112.

The switching circuit 101 includes a common terminal, and two selection terminals. The common terminal is connected with the antenna 2. Of the two selection terminals, one is connected with the matching circuit 111 in the receive signal path, and the other is connected with the matching circuit 113 in the transmit signal path.

The matching circuit 111 is connected between the switching circuit 101 and the low-noise amplifier circuit 121. The matching circuit 111 matches the impedance between the switching circuit 101 and the low-noise amplifier circuit 121.

The matching circuit 112 is connected between the low-noise amplifier circuit 121 and the RFIC 3. The matching circuit 112 matches the impedance between the low-noise amplifier circuit 121 and the RFIC 3.

The matching circuit 113 is connected between the switching circuit 101 and the power amplifier circuit 131. The matching circuit 113 matches the impedance between the switching circuit 101 and the power amplifier circuit 131.

The matching circuit 114 is connected between the power amplifier circuit 131 and the power amplifier circuit 132. The matching circuit 114 matches the impedance between the power amplifier circuit 131 and the power amplifier circuit 132.

The matching circuit 115 is connected between the power amplifier circuit 132 and the power amplifier circuit 133. The matching circuit 115 matches the impedance between the power amplifier circuit 132 and the power amplifier circuit 133.

The matching circuit 116 is connected between the power amplifier circuit 133 and the RFIC 3. The matching circuit 116 matches the impedance between the power amplifier circuit 133 and the RFIC 3.

The low-noise amplifier circuit 121 is an amplifier circuit that receives a radio-frequency receive signal, and amplifies the radio-frequency receive signal at low noise. The low-noise amplifier circuit 121 includes an input terminal connected with the matching circuit 111, and an output terminal connected with the matching circuit 112.

The power amplifier circuit 131 is an amplifier circuit that receives a radio-frequency transmit signal, and amplifies the radio-frequency transmit signal. The power amplifier circuit 131 includes an input terminal connected with the matching circuit 114, and an output terminal connected with the matching circuit 113.

The power amplifier circuit 132 is an amplifier circuit that receives a radio-frequency transmit signal, and amplifies the radio-frequency transmit signal. The power amplifier circuit 132 includes an input terminal connected with the matching circuit 115, and an output terminal connected with the matching circuit 114.

The power amplifier circuit 133 is an amplifier circuit that receives a radio-frequency transmit signal, and amplifies the radio-frequency transmit signal. The power amplifier circuit 133 includes an input terminal connected with the matching circuit 116, and an output terminal connected with the matching circuit 115.

The power amplifier circuits 131, 132, and 133 are in cascading connection with each other. The power amplifier circuit 131 is connected in the last stage of the cascade of the power amplifier circuits 131, 132, and 133. In the first example of the communication apparatus 5 illustrated in FIG. 2, the power amplifier circuits 131, 132, and 133 each represent an example of a first power amplifier circuit included in the first semiconductor device 10.

For example, the first semiconductor device 10 includes a detector circuit (not illustrated) that detects a characteristic parameter of each of the power amplifier circuits 131, 132, and 133. The second semiconductor device 20 includes a characteristic adjustment circuit that, based on the characteristic parameter detected by the detector circuit, adjusts the characteristic parameter. The first semiconductor device 10 and the second semiconductor device 20 are electrically connected with each other by the electric conductor. This allows the characteristic adjustment circuit to, based on the characteristic parameter detected by the detector circuit, adjust the characteristic parameter. The characteristic parameter includes at least one of the impedance, phase, or power of each of the power amplifier circuits 131, 132, and 133. The detector circuit is, for example, a coupler. The control circuit 141 is an example of the characteristic adjustment circuit.

The control circuit 141 controls the switching circuit 101, the matching circuits 111, 112, 113, 114, 115, and 116, the low-noise amplifier circuit 121, and the power amplifier circuits 131, 132, and 133.

For example, the control circuit 141 controls the connection between the common terminal and each of the two selection terminals of the switching circuit 101 to thereby switch whether to connect the antenna 2 with the receive signal path or to connect the antenna 2 with the transmit signal path.

For example, each matching circuit includes one or more inductors, one or more capacitors, and one or more switches that switch the connections of the one or more inductors and the one or more capacitors. For example, the control circuit 141 controls the one or more switches to adjust the relative connections (i.e., the matching parameters) of the one or more inductors and the one or more capacitors, and to adjust the respective input/output impedances of the low-noise amplifier circuit 121 and the power amplifier circuit 131, 132, and 133 with which the corresponding matching circuits are connected. The control circuit 141 is also capable of adjusting the respective phases of the low-noise amplifier circuit 121 and the power amplifier circuits 131, 132, and 133 by controlling the matching circuits.

For example, the control circuit 141 controls the respective gains of the low-noise amplifier circuit 121 and the power amplifier circuits 131, 132, and 133. This allows the control circuit 141 to adjust the respective powers of the low-noise amplifier circuit 121 and the power amplifier circuits 131, 132, and 133.

For example, the low-noise amplifier circuit 121 and the power amplifier circuits 131, 132, and 133 may each be connected with a phaser, and the control circuit 141 may control the phaser to control the phase of each of the low-noise amplifier circuit 121 and the power amplifier circuits 131, 132, and 133.

The first semiconductor device 10 includes a temperature sensor that detects the temperature of the power amplifier circuit 131. The second semiconductor device 20 includes a bias adjustment circuit that, based on the temperature detected by the temperature sensor, adjusts a bias that is to be supplied to the power amplifier circuit 131. The control circuit 141 is an example of the bias adjustment circuit. The configuration in this case is described below with reference to FIG. 3.

[Circuit Configuration of Bias Adjustment Circuit]

Figure 3:
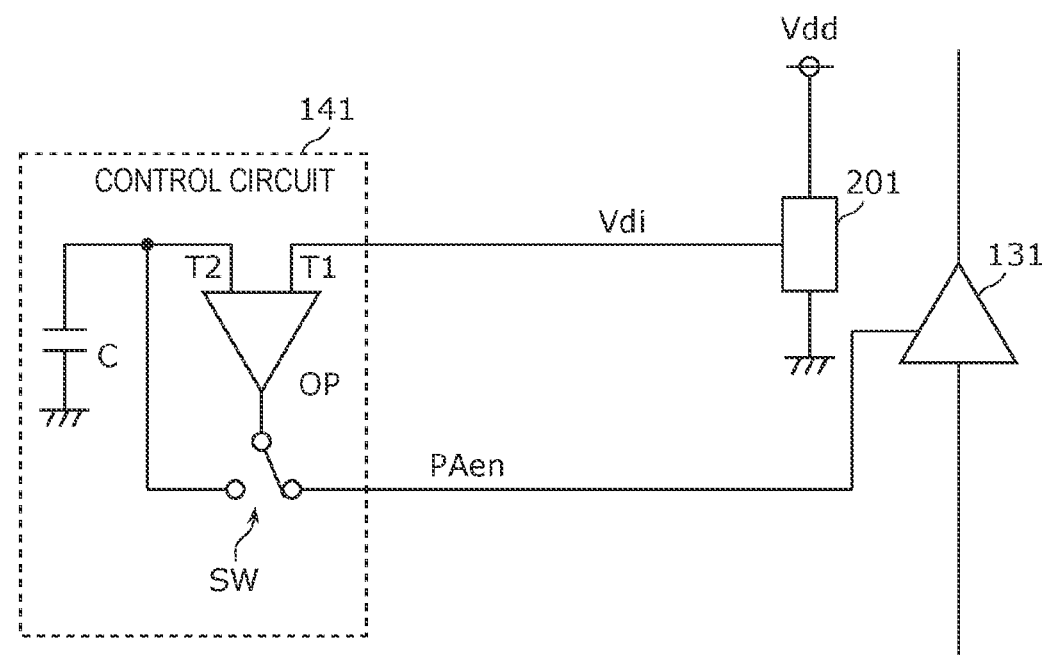
FIG. 3 is a circuit diagram illustrating an example of a bias adjustment circuit according to the embodiment.

FIG. 3 is a circuit diagram illustrating an example of the control circuit 141 (bias adjustment circuit) according to the embodiment. In addition to the control circuit 141, the power amplifier circuit 131 and a temperature sensor 201 are depicted in FIG. 3.

The temperature sensor 201 is in thermal coupling with the power amplifier circuit 131, and generates a temperature detection signal Vdi based on the temperature of the power amplifier circuit 131. That is, the temperature sensor 201 receives (detects) the heat generated by the power amplifier circuit 131, and generates the temperature detection signal Vdi based on the temperature of the power amplifier circuit 131.

The control circuit 141 outputs, based on the temperature detection signal Vdi, a bias control signal PAen to the power amplifier circuit 131. The control circuit 141 includes an operational amplifier OP, a capacitor C, and a switch SW. The operational amplifier OP includes a first input terminal T1 with which the temperature sensor 201 is connected, and a second input terminal T2 with which the capacitor C is connected. The switch SW is connected with the output of the operational amplifier OP. The switch SW switches between a state in which the output voltage of the operational amplifier OP is to be charged to the capacitor C, and a state in which the output voltage is to be outputted to the power amplifier circuit 131 as the bias control signal PAen.

First, at the start of the operation of the power amplifier circuit 131, the switch SW goes into a state in which the output voltage of the operational amplifier OP is to be charged to the capacitor C. In other words, at the start of the operation of the power amplifier circuit 131, the voltage of the temperature detection signal Vdi inputted from the temperature sensor 201 to the first input terminal T1 is charged to the capacitor C as a voltage that is representative of a reference temperature of the power amplifier circuit 131 at the start of the operation of the power amplifier circuit 131. The switch SW then goes into a state in which the output voltage of the operational amplifier OP is to be outputted to the power amplifier circuit 131 as the bias control signal PAen. That is, after the start of the operation of the power amplifier circuit 131, the output voltage of the operational amplifier OP is outputted to the power amplifier circuit 131 as the bias control signal PAen. The output voltage to be outputted at this time represents the result of the comparison between the voltage of the temperature detection signal Vdi that is inputted from the first input terminal T1 of the operational amplifier OP as needed, and a voltage inputted from the second input terminal T2 and representative of the reference voltage that has been charged to the capacitor C.

The power amplifier circuit 131 has an amplification factor that increases with increasing voltage of the bias control signal PAen. Accordingly, the configuration and operation mentioned above make it possible to control the power amplifier circuit 131 such that a decrease in the amplification factor of the power amplifier circuit 131 associated with an increase in temperature is mitigated and an appropriate amplification factor is maintained.

The function of the control circuit 141 may, in whole or in part, be included in the RFIC 3.

Circuit Configuration of Communication Apparatus: Second Example

Although the first example of the communication apparatus 5 illustrated in FIG. 2 is directed to a case in which the power amplifier circuits 132 and 133, and the matching circuits 114, 115, and 116 connected with the power amplifier circuits 132 and 133 are included in the first semiconductor device 10, these circuits may be included in the second semiconductor device 20. The configuration in this case is described below with reference to FIG. 4 as a second example of the communication apparatus 5.

Figure 4:
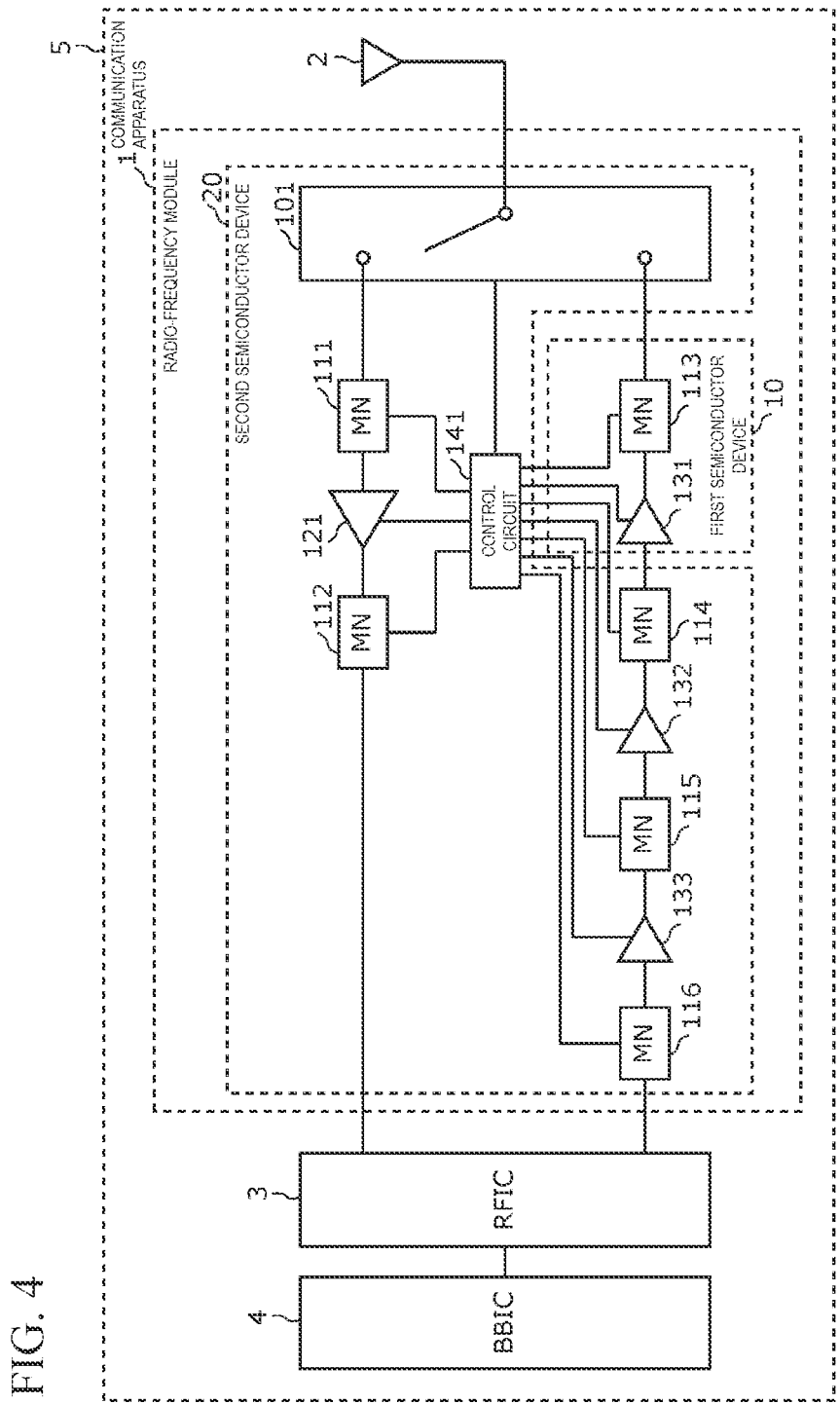
FIG. 4 is a circuit diagram illustrating a second example of the communication apparatus according to the embodiment.

FIG. 4 is a circuit diagram illustrating the second example of the communication apparatus 5 according to the embodiment.

In the second example of the communication apparatus 5 illustrated in FIG. 4, the first semiconductor device 10 includes the power amplifier circuit 131 and the matching circuit 113, and the second semiconductor device 20 includes the low-noise amplifier circuit 121, the switching circuit 101, the control circuit 141, the power amplifier circuits 132 and 133, and the matching circuits 111, 112, 114, 115 and 116. Other features of the second example are the same as those of the first example, and thus will not be described below in further detail.

In the second example of the communication apparatus 5 illustrated in FIG. 4, the power amplifier circuit 131 represents an example of a first power amplifier circuit included in the first semiconductor device 10, and the power amplifier circuits 132 and 133 each represent an example of a second power amplifier circuit included in the second semiconductor device 20 and in cascading connection with the first power amplifier circuit. As illustrated in FIG. 4, not all of the power amplifier circuits 131, 132, and 133 in cascading connection with each other may be included in the first semiconductor device 10. Alternatively, only the power amplifier circuit 131, which is the power amplifier circuit in the last stage, may be included in the first semiconductor device 10, and the power amplifier circuits 132 and 133 may be included in the second semiconductor device 20.

Circuit Configuration of Communication Apparatus: Third Example

Although the first example of the communication apparatus 5 illustrated in FIG. 2 is directed to a case in which the matching circuits 113 and 114 connected with the power amplifier circuit 131 are included in the first semiconductor device 10, these circuits may be included in the multilayer substrate 30. The configuration in this case is described below with reference to FIG. 5 as a third example of the communication apparatus 5.

Figure 5:
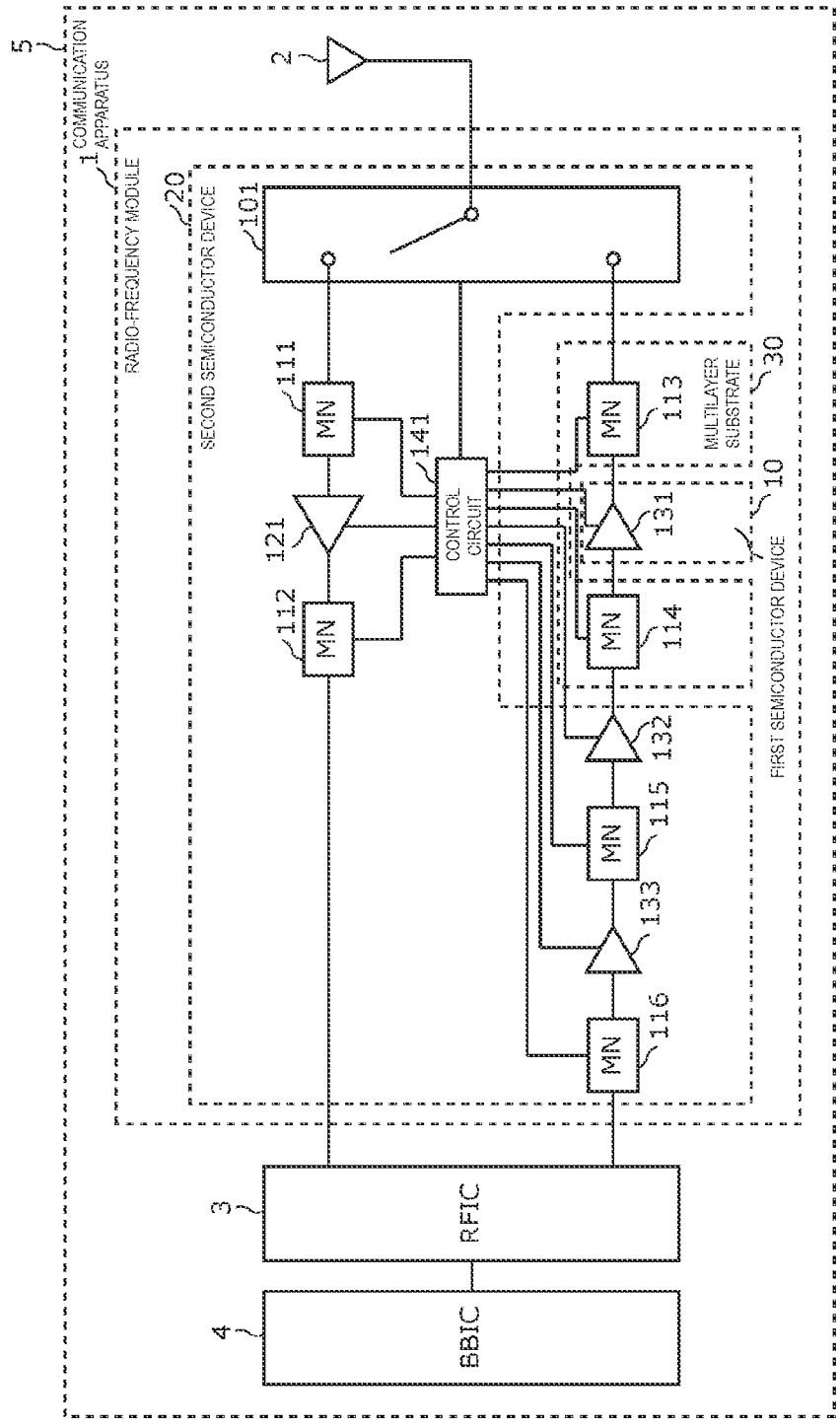
FIG. 5 is a circuit diagram illustrating a third example of the communication apparatus according to the embodiment.

FIG. 5 is a circuit diagram illustrating the third example of the communication apparatus 5 according to the embodiment.

In the third example of the communication apparatus 5 illustrated in FIG. 5, the first semiconductor device 10 includes the power amplifier circuit 131, the second semiconductor device 20 includes the low-noise amplifier circuit 121, the switching circuit 101, the control circuit 141, the power amplifier circuits 132 and 133, and the matching circuits 111, 112, 115, and 116, and the multilayer substrate 30 includes the matching circuits 113 and 114. Other features of the third example are the same as those of the first example, and thus will not be described below in further detail.

In the third example of the communication apparatus 5 illustrated in FIG. 5, the power amplifier circuit 131 represents an example of a first power amplifier circuit included in the first semiconductor device 10, and the power amplifier circuits 132 and 133 each represent an example of a second power amplifier circuit included in the second semiconductor device 20 and in cascading connection with the first power amplifier circuit. As illustrated in FIG. 5, the matching circuits 113 and 114 connected with the power amplifier circuit 131 do not have to be built in the first semiconductor device 10 but may be built in the multilayer substrate 30. Rather than both the matching circuit 114 connected with the input of the power amplifier circuit 131, and the matching circuit 113 connected with the output of the power amplifier circuit 131, only one of the matching circuits 113 and 114 may be built in the multilayer substrate 30.

Concluding Remarks

The radio-frequency module 1 includes the multilayer substrate 30, the first semiconductor device 10, the second semiconductor device 20, the first mold layer 71, and the second mold layer 72. The multilayer substrate 30 includes a plurality of stacked layers, and has the first major face 31 and the second major face 32. The first mold layer 71 seals the first semiconductor device 10. The second mold layer 72 seals the second semiconductor device 20. The first major face 31 includes the first recess 40. The first semiconductor device 10 is mounted over a bottom face of the first recess 40. The second semiconductor device 20 is mounted over the first major face 31 so as to overlie the first recess 40. The first semiconductor device 10 is connected with the metallic via 33. The metallic via 33 extends through a portion of the multilayer substrate 30 from the bottom face of the first recess 40 to the second major face 32. The first mold layer 71 and the second mold layer 72 are made of different materials.

According to the above configuration, in a portion of the multilayer substrate 30 where the first recess 40 is present, the multilayer substrate 30 is reduced in thickness by an amount equal to the depth of the first recess 40. This means that the metallic via 33, which extends through a portion of the multilayer substrate 30 from the bottom face of the first recess 40 to the second major face 32, can be likewise reduced in length by the corresponding amount. That is, the path of the heat dissipation by the metallic via 33 can be reduced in length, which helps to improve the heat dissipation capability of the multilayer substrate 30. In other words, the heat generated by the first semiconductor device 10 can be effectively dissipated by use of the metallic via 33. If the metallic via 33 is to be provided for each layer of the multilayer substrate 30, the reduced length of the metallic via 33 leads to the reduced time and effort associated with manufacture and consequently the reduced manufacturing cost. Further, the first semiconductor device 10 is mounted in the first recess 40, and the second semiconductor device 20 is mounted over the first major face 31 so as to overlie the first recess 40 in which the first semiconductor device 10 is mounted. This helps to reduce the size of the radio-frequency module 1 in comparison to a case where the first semiconductor device 10 and the second semiconductor device 20 are mounted in the same plane.

For example, a wafer or other workpiece made up of a collection of multiple radio-frequency modules 1 may be cut with a dicing machine to produce each individual radio-frequency module 1. For this process, the second mold layer 72 for sealing the second semiconductor device 20 is desired to be made of a material that can be worked easily (e.g., can be cut with a dicing machine easily). In contrast, the first mold layer 71 for sealing the first semiconductor device 10 within the first recess 40 is not desired to be made of a material that can be worked easily, but desired to be made of, for example, a material that easily dissipates heat. If the first mold layer 71 and the second mold layer 72 are both made of the same material that easily dissipates heat, this may help to improve the heat dissipation capability of the radio-frequency module 1 but may lead to warping of the wafer or other workpiece and consequently compromise the workability of the wafer or other workpiece. If the first mold layer 71 and the second mold layer 72 are both made of the same material that is easily workable, this may help to improve the workability of the wafer or other workpiece but may lead to the reduced heat dissipation capability of the radio-frequency module 1. Accordingly, the first mold layer 71 and the second mold layer 72 are made of different materials to achieve both easy workability and easy heat dissipation.

For example, the first mold layer 71 may have a thermal conductivity higher than a thermal conductivity of the second mold layer 72.

This configuration allows for the improved heat dissipation in the first recess 40 of the multilayer substrate 30.

For example, the first mold layer 71 may cover a top face of the first semiconductor device 10, which is a face of the first semiconductor device 10 opposite from its face near the bottom face of the first recess 40.

According to the above configuration, the first mold layer 71 seals the first semiconductor device 10 while covering the entire first semiconductor device 10 including its top face. The heat generated by the first semiconductor device 10 can be thus dissipated also from the top face of the first semiconductor device 10 by way of the first mold layer 71.

For example, the first mold layer 71 does not have to cover a top face of the first semiconductor device 10, which is a face of the first semiconductor device 10 opposite from its face near the bottom face of the first recess 40.

As described above, the second semiconductor device 20 is positioned over the first semiconductor device 10 so as to overlie the first recess 40 in which the first semiconductor device 10 is mounted. At this time, if the top face of the first semiconductor device 10 is covered by the first mold layer 71, this results in a raised area of the first mold layer 71 being created on the top face of the first semiconductor device 10. In this case, a situation can arise where the bottom face of the second semiconductor device 20 comes into contact with the raised area of the first mold layer 71, which makes the mounting of the second semiconductor device 20 difficult. Accordingly, the first mold layer 71 is applied to seal the first semiconductor device 10 in such a way that the first mold layer 71 does not cover the top face of the first semiconductor device 10. This helps to facilitate the mounting of the second semiconductor device 20.

For example, the first semiconductor device 10 may include a compound semiconductor substrate, and the second semiconductor device 20 may include a silicon semiconductor substrate.

The first semiconductor device 10 including the compound semiconductor substrate is poorer in the heat dissipation and more susceptible to generating the heat than the second semiconductor device 20 including the silicon semiconductor substrate. Accordingly, connecting the first semiconductor device 10, which is more susceptible to generating the heat than the second semiconductor device 20, with the metallic via 33 in the first recess 40 makes it possible to more effectively mitigate the heat generation from the radio-frequency module 1 than connecting the second semiconductor device 20 with the metallic via 33 in the first recess 40.

For example, the second semiconductor device 20 may include at least one of the low-noise amplifier circuit 121, the switching circuit 101, or the control circuit 141. For example, the first semiconductor device 10 may include the first power amplifier circuit.

The first semiconductor device 10 including the first power amplifier circuit is more susceptible to generating the heat than the second semiconductor device 20 including at least one of the low-noise amplifier circuit 121, the switching circuit 101, or the control circuit 141. Accordingly, connecting the first semiconductor device 10, which is more susceptible to generating the heat than the second semiconductor device 20, with the metallic via 33 in the first recess 40 makes it possible to more effectively mitigate the heat generation from the radio-frequency module 1 than connecting the second semiconductor device 20 with the metallic via 33 in the first recess 40.

For example, the multilayer substrate 30 may include an electric conductor (e.g., the conductor film 35 and the metallic via 36) that is disposed at least inside the multilayer substrate 30 and electrically connects the first semiconductor device 10 and the second semiconductor device 20 with each other.

The above configuration allows for the exchange of information or signals between the first semiconductor device 10 and the second semiconductor device 20. For example, this makes it possible to, based on the exchanged information or signals, perform operations such as compensation for the characteristics of a circuit included in the first semiconductor device 10 or the characteristics of a circuit included in the second semiconductor device 20. Since the electric conductor is disposed at least inside the multilayer substrate 30, the radio-frequency module 1 can be reduced in size in comparison to a case where the entire conductor is provided outside the multilayer substrate 30 (e.g., such as when wire bonding is employed). The first semiconductor device 10 mounted in the first recess 40, and the second semiconductor device 20 mounted so as to overlie the first recess 40 may be positioned to overlap one above the other. This makes it possible to shorten the electric conductor that connects the first semiconductor device 10 and the second semiconductor device 20 with each other, and to consequently reduce the transmission loss in the electric conductor.

For example, the first semiconductor device 10 may further include the temperature sensor 201 that detects a temperature of the first power amplifier circuit, and the second semiconductor device 20 may include the control circuit 141 (bias adjustment circuit) that, based on the temperature detected by the temperature sensor 201, adjusts a bias that is to be supplied to the first power amplifier circuit.

The first power amplifier circuit may have an amplification factor that varies with time due to the heat generated by the first power amplifier circuit itself. Accordingly, the bias to be supplied to the first power amplifier circuit is adjusted based on the temperature of the first power amplifier circuit detected by the temperature sensor 201. That is, even if the temperature of the first power amplifier circuit changes, a bias that varies with the temperature of the first power amplifier circuit is supplied to the first power amplifier circuit. This allows the amplification factor of the first power amplifier circuit to be maintained at an appropriate value.

For example, the first semiconductor device 10 may further include a detector circuit that detects a characteristic parameter of the first power amplifier circuit, and the second semiconductor device 20 may include a characteristic adjustment circuit that, based on the characteristic parameter detected by the detector circuit, adjusts the characteristic parameter. For example, the characteristic parameter may include at least one of impedance, phase, or power of the first power amplifier circuit.

The above configuration makes it possible to, as the situation demands, perform the adjustment or compensation for a characteristic parameter of the first power amplifier circuit, such as impedance, phase, or power of the first power amplifier circuit.

For example, the second semiconductor device 20 may further include a second power amplifier circuit (e.g., the power amplifier circuit 132 or 133) in cascading connection with the first power amplifier circuit.

According to the above configuration, not all of the power amplifier circuits in cascading connection with each other are included in the first semiconductor device 10. Rather, the second power amplifier circuit in cascading connection with the first power amplifier circuit is included in the second semiconductor device 20. This makes it possible to reduce the size of the first semiconductor device 10. For instance, the first semiconductor device 10 including a compound semiconductor substrate is often expensive. The ability to reduce the size of the first semiconductor device 10 thus helps to reduce the cost of the radio-frequency module 1. Of the power amplifier circuits in cascading connection with each other, the power amplifier circuit in the last stage is most susceptible to generating the heat. Accordingly, the heat generation from the radio-frequency module 1 can be mitigated by employing a configuration in which at least the power amplifier circuit in the last stage is included as the first power amplifier circuit in the first semiconductor device 10 with which the metallic via 33 is connected. In other words, even if the first semiconductor device 10 does not include the second power amplifier circuit, which is a power amplifier circuit other than the first power amplifier circuit located in the last stage of the cascade of power amplifier circuits, such a configuration is not likely to lead to the increased heat generation from the radio-frequency module 1, and the heat generation from the radio-frequency module 1 can be mitigated.

For example, the multilayer substrate 30 may include a matching circuit (e.g., the matching circuit 113 or 114) built in the multilayer substrate 30. The matching circuit is connected with the first power amplifier circuit.

According to the above configuration, the matching circuit connected with the first power amplifier circuit is built in the multilayer substrate 30 rather than being provided in the first semiconductor device 10 including the first power amplifier circuit. This helps to reduce the size of the first semiconductor device 10 and, as described above, reduce the cost of the radio-frequency module 1.

For example, the radio-frequency module 1 may further include the mount component 60 having a thickness greater than a thickness of the second semiconductor device 20. The first major face 31 may include the second recess 50, and the mount component 60 may be mounted onto a bottom face of the second recess 50.

If the mount component 60 having a thickness greater than a thickness of the second semiconductor device 20 is to be directly mounted onto the first major face 31, the overall thickness of the radio-frequency module 1 increases due to the mount component 60 having a thickness greater than a thickness of the second semiconductor device 20. Accordingly, the mount component 60 is mounted on the bottom face of the second recess 50 so that the profile of the radio-frequency module 1 can be reduced by an amount corresponding to the depth of the second recess 50.

For example, the second recess 50 may have a depth less than a depth of the first recess 40.

For example, in mounting the mount component 60 (e.g., a chip component) onto the bottom face of the second recess 50 of the multilayer substrate 30, solder applied on the multilayer substrate 30 is used. At this time, if the second recess 50 has a large depth, it is difficult to apply solder onto the bottom face of the second recess 50. Accordingly, the second recess 50 is made to have a depth less than a depth of the first recess 40 to facilitate application of solder onto the bottom face of the second recess 50. This helps to improve the ease of mounting.

The communication apparatus 5 includes the RFIC 3 that processes a radio-frequency signal transmitted and received by the antenna 2, and the radio-frequency module 1 that propagates the radio-frequency signal between the antenna 2 and the RFIC 3.

The above configuration makes it possible to provide the communication apparatus 5 that allows for the improved heat dissipation capability of the multilayer substrate 30.

Other Embodiments

Although the radio-frequency module 1 and the communication apparatus 5 according to the present disclosure have been described above by way of embodiments, the present disclosure is not limited to the embodiments described above. The present disclosure is intended to encompass other embodiments implemented by combining given components in the above embodiments, modifications obtained by modifying the above embodiments in various ways as may become apparent to one skilled in the art without departing from the scope of the present disclosure, and various kinds of equipment incorporating the radio-frequency module 1 or the communication apparatus 5 according to the present disclosure.

For example, although the foregoing description of the embodiments is directed to a case in which the first semiconductor device 10 includes a first power amplifier circuit, and the first semiconductor device 10 includes a compound semiconductor substrate, this is not intended to be limiting. For example, the first semiconductor device 10 does not have to include a first power amplifier circuit, and does not have to include a compound semiconductor substrate.

For example, although the foregoing description of the embodiments is directed to a case in which the second semiconductor device 20 includes at least one of a low-noise amplifier circuit, a switching circuit, or a control circuit, and the second semiconductor device 20 includes a silicon semiconductor substrate, this is not intended to be limiting. For example, the second semiconductor device 20 does not have to include at least one of a low-noise amplifier circuit, a switching circuit, or a control circuit, and does not have to include a silicon semiconductor substrate.

For example, although the foregoing description of the embodiments is directed to a case in which the first semiconductor device 10 includes a temperature sensor that detects the temperature of the first power amplifier circuit and the second semiconductor device 20 includes a bias adjustment circuit that adjusts a bias that is to be supplied to the first power amplifier circuit, this is not intended to be limiting. For example, the first semiconductor device 10 does not have to include a temperature sensor, and the second semiconductor device 20 does not have to include a bias adjustment circuit.

For example, although the foregoing description of the embodiments is directed to a case in which the first semiconductor device 10 includes a detector circuit that detects a characteristic parameter of the first power amplifier circuit, and the second semiconductor device 20 includes a characteristic adjustment circuit that adjusts the characteristic parameter, this is not intended to be limiting. For example, the first semiconductor device 10 does not have to include a detector circuit, and the second semiconductor device 20 does not have to include a characteristic adjustment circuit.

For example, although the foregoing description of the embodiments is directed to a case in which the multilayer substrate 30 includes an electric conductor disposed at least inside the multilayer substrate 30 and electrically connecting the first semiconductor device 10 and the second semiconductor device 20 with each other, this is not intended to be limiting. For example, the multilayer substrate 30 does not have to include an electric conductor that electrically connects the first semiconductor device 10 and the second semiconductor device 20 with each other. For example, an electric conductor that electrically connects the first semiconductor device 10 and the second semiconductor device 20 with each other may be disposed outside the multilayer substrate 30 (e.g., wire bonding may be employed). In another example, the radio-frequency module 1 does not have to be provided with an electric conductor that electrically connects the first semiconductor device 10 and the second semiconductor device 20 with each other.

For example, although the foregoing description of the embodiments is directed to a case in which the radio-frequency module 1 includes the mount component 60, the radio-frequency module 1 does not have to include the mount component 60. In this case, the first major face 31 of the multilayer substrate 30 does not have to include the second recess 50.

For example, the radio-frequency module 1 may include a shield layer that covers the mold layer 70.

The present disclosure can be used for a wide variety of equipment required to be capable of dissipating heat.

1 radio-frequency module
2 antenna
3 RFIC
4 BBIC
5 communication apparatus
10 first semiconductor device
20 second semiconductor device
30 multilayer substrate
31 first major face
32 second major face
33, 36 metallic via
35 conductor film
40 first recess
50 second recess
60 mount component
70 mold layer
71 first mold layer
72 second mold layer
101 switching circuit
111, 112, 113, 114, 115, 116 matching circuit
121 low-noise amplifier circuit
131, 132, 133 power amplifier circuit
141 control circuit
201 temperature sensor
C capacitor
OP operational amplifier
SW switch
T1 first input terminal
T2 second input terminal

The invention claimed is:
1. A radio-frequency module comprising:
a multilayer substrate including a plurality of stacked layers, the multilayer substrate having a first major face and a second major face;

a first semiconductor device;
a second semiconductor device;
a first mold layer sealing the first semiconductor device; and
a second mold layer sealing the second semiconductor device,
wherein the first major face includes a first recess,
wherein the first semiconductor device is mounted over a bottom face of the first recess,
wherein the first mold layer is disposed in the first recess,
wherein the second semiconductor device is mounted over the first major face so as to overlie the first recess,
wherein the first semiconductor device is connected with a metallic via, the metallic via extending from the bottom face of the first recess to the second major face, and
wherein the first mold layer and the second mold layer comprise different materials.

2. The radio-frequency module according to claim 1, wherein the first mold layer covers a top face of the first semiconductor device, the top face of the first semiconductor device being a face of the first semiconductor device opposite from a face near a bottom face of the first recess.

3. The radio-frequency module according to claim 1, wherein the first mold layer does not cover a top face of the first semiconductor device, the top face of the first semiconductor device being a face of the first semiconductor device opposite from a face near a bottom face of the first recess.

4. The radio-frequency module according to claim 1, wherein the second semiconductor device includes at least one of a low-noise amplifier circuit, a switching circuit, or a control circuit.

5. The radio-frequency module according to claim 1, wherein the first semiconductor device includes a first power amplifier circuit.

6. The radio-frequency module according to claim 5, wherein the multilayer substrate includes an electric conductor, the electric conductor being disposed at least inside the multilayer substrate and electrically connecting the first semiconductor device and the second semiconductor device with each other.

7. The radio-frequency module according to claim 6, wherein the first semiconductor device further includes a temperature sensor configured to detect a temperature of the first power amplifier circuit, and
wherein the second semiconductor device includes a bias adjustment circuit, based on the temperature detected by the temperature sensor, configured to adjust a bias to be supplied to the first power amplifier circuit.

8. The radio-frequency module according to claim 6, wherein the first semiconductor device further includes a detector circuit configured to detect a characteristic parameter of the first power amplifier circuit, and
wherein the second semiconductor device includes a characteristic adjustment circuit, based on the characteristic parameter detected by the detector circuit, configured to adjust the characteristic parameter.

9. The radio-frequency module according to claim 8, wherein the characteristic parameter includes at least one of impedance, phase, or power of the first power amplifier circuit.

10. The radio-frequency module according to claim 5, wherein the second semiconductor device further includes a second power amplifier circuit in cascading connection with the first power amplifier circuit.

11. The radio-frequency module according to claim 5, wherein the multilayer substrate includes a matching circuit built in the multilayer substrate, the matching circuit being connected with the first power amplifier circuit.

12. The radio-frequency module according to claim 1, further comprising
a mount component having a thickness greater than a thickness of the second semiconductor device, the mount component being a component to be mounted,
wherein the first major face includes a second recess, and
wherein the mount component is mounted onto a bottom face of the second recess.

13. The radio-frequency module according to claim 12, wherein the second recess has a depth less than a depth of the first recess.

14. A communication apparatus comprising:
a radio-frequency integrated circuit configured to process a radio-frequency signal transmitted and received by an antenna; and
the radio-frequency module according to claim 1 configured to propagate the radio-frequency signal between the antenna and the radio-frequency integrated circuit.

15. A radio-frequency module comprising:
a multilayer substrate including a plurality of stacked layers, the multilayer substrate having a first major face and a second major face;
a first semiconductor device;
a second semiconductor device;
a first mold layer sealing the first semiconductor device; and
a second mold layer sealing the second semiconductor device,
wherein the first major face includes a first recess,
wherein the first semiconductor device is mounted over a bottom face of the first recess,
wherein the second semiconductor device is mounted over the first major face so as to overlie the first recess,
wherein the first semiconductor device is connected with a metallic via, the metallic via extending through a portion of the multilayer substrate from the bottom face of the first recess to the second major face,
wherein the first mold layer and the second mold layer comprise different materials, and
wherein the first mold layer has a thermal conductivity higher than a thermal conductivity of the second mold layer.

16. The radio-frequency module according to claim 15, wherein the first mold layer does not cover a top face of the first semiconductor device, the top face of the first semiconductor device being a face of the first semiconductor device opposite from a face near a bottom face of the first recess.

17. The radio-frequency module according to claim 15, wherein the first semiconductor device includes a compound semiconductor substrate, and
wherein the second semiconductor device includes a silicon semiconductor substrate.

18. The radio-frequency module according to claim 2, wherein the first semiconductor device includes a compound semiconductor substrate, and
wherein the second semiconductor device includes a silicon semiconductor substrate.

19. The radio-frequency module according to claim 15, wherein the first mold layer covers a top face of the first semiconductor device, the top face of the first semiconductor device being a face of the first semiconductor device opposite from a face near a bottom face of the first recess.

20. A radio-frequency module comprising:
a multilayer substrate including a plurality of stacked layers, the multilayer substrate having a first major face and a second major face;
a first semiconductor device;
a second semiconductor device;
a first mold layer sealing the first semiconductor device; and
a second mold layer sealing the second semiconductor device,
wherein the first major face includes a first recess,
wherein the first semiconductor device is mounted over a bottom face of the first recess,
wherein the second semiconductor device is mounted over the first major face so as to overlie the first recess,
wherein the first semiconductor device is connected with a metallic via, the metallic via extending through a portion of the multilayer substrate from the bottom face of the first recess to the second major face,
wherein the first mold layer and the second mold layer comprise different materials,
wherein the first semiconductor device includes a compound semiconductor substrate, and
wherein the second semiconductor device includes a silicon semiconductor substrate.

* * * * *